US006963787B2

(12) United States Patent
Takada et al.

(10) Patent No.: US 6,963,787 B2
(45) Date of Patent: Nov. 8, 2005

(54) ARTICLE TO BE PROCESSED HAVING ID, AND PRODUCTION METHOD THEREOF

(75) Inventors: Takeshi Takada, Kyoto (JP); Toshihiko Mimura, Nara (JP); Naoto Okada, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 51 days.

(21) Appl. No.: 10/207,865

(22) Filed: Jul. 31, 2002

(65) Prior Publication Data

US 2003/0049881 A1    Mar. 13, 2003

(30) Foreign Application Priority Data

Aug. 2, 2001  (JP)  .............................. 2001-234392

(51) Int. Cl.[7] .............................................. G06F 19/00
(52) U.S. Cl. ...................................... 700/116; 136/252
(58) Field of Search ........................ 700/103, 116, 125, 700/171, 213, 215, 221–227, 115; 136/252, 136/243, 244, 200; 235/462.01–462.07, 462.08; 283/70

(56) References Cited

U.S. PATENT DOCUMENTS

| | | | | |
|---|---|---|---|---|
| 5,118,369 A | * | 6/1992 | Shamir | 156/64 |
| 5,314,176 A | * | 5/1994 | Schmitt | 270/1.03 |
| 6,244,764 B1 | * | 6/2001 | Lei et al. | 400/103 |
| 6,265,242 B1 | | 7/2001 | Komori et al. | 438/66 |
| 6,550,685 B1 | * | 4/2003 | Kindberg | 235/494 |
| 6,629,639 B2 | * | 10/2003 | Bengala | 235/454 |
| 6,722,568 B2 | * | 4/2004 | Blanford et al. | 235/462.11 |
| 6,726,104 B2 | * | 4/2004 | Schuessler et al. | 235/462.09 |

FOREIGN PATENT DOCUMENTS

JP          7-321354        12/1995

OTHER PUBLICATIONS

Chilcote, "The Bar Code PROfessional" For Creating Accurate Bar Codes, MacAttitude, Jul. 1999.*
M. Izu, "Photovoltaic Manufacturing Technology, Phase 1", National Renewal Energy Laboratory, Mar. 1992.*
Menlo Park, "Just press print", The Economist, Mar. 2001.*
Tarrant et al., "High Yield CIS Production—Progress & Perspectives".*

* cited by examiner

Primary Examiner—Leo Picard
Assistant Examiner—Carlos Ortiz Rodriguez
(74) Attorney, Agent, or Firm—Fitzpatrick, Cella, Harper & Scinto

(57) ABSTRACT

A processed article is provided with a plurality of IDs having the same information for machine reading but difference to be confirmed visually. The information such as the production lot number which is read from the plurality of IDs by the reading device is the same, but these plurality of IDs are different in external appearance, for example in size or color. By corresponding such difference of the plurality of IDs in the external appearance to the positional information in the processing apparatus for the article, new information can be added to the ID without introducing a new ID printer or a reading device. A prompt measure to a trouble in production is made possible based on the information such as the position of the article. Also the defective processed article can be easily selected, thereby improving the production yield and achieving a cost reduction.

15 Claims, 9 Drawing Sheets

ARTICLE TO BE PROCESSED HAVING ID, AND PRODUCTION METHOD THEREOF

BACKGROUND OF THE INVENTION

1. Field of the Invention

The present invention relates to an article to be processed having identification (ID) and a method of producing the article.

2. Related Background Art

Attaching an ID to an article to be processed is widely adopted for the production management thereof.

For example, solar cell modules are produced principally in 6 V type and 12 V type, and the assembly of photovoltaic elements and the systemization by linking with a battery or with an inverter have to be executed corresponding to such output type. Also a solar cell module integral with a roofing material has been actively developed for use in ordinary houses, and various products in size and color have to be manufactured because the design of the roof is considered important. For this reason, there are required various photovoltaic elements different in size and in output, and the manufacturing process is managed by providing each photovoltaic element with an ID.

On the other hand, for mass producing the photovoltaic elements of various sizes, there are required mass production lines corresponding to such sizes. If these elements are to be produced in a line, the productivity will be deteriorated since a change or an adjustment in the conveying mechanism and the aligning mechanism for the supply of each component is required for each type of the elements. Also the tact time of the mass production line is limited and becomes the same for a photovoltaic element of a large size and that of a small size, and the production efficiency in terms of the produced area becomes deteriorated. Therefore, the productivity inevitably becomes low and the production cost becomes high if the photovoltaic elements of various sizes are to be manufactured by such method.

On the other hand, Japanese Patent Application Laid-Open No. 7-321354 discloses a method of producing the photovoltaic elements of various sizes on a single production line with a high productivity. It also discloses a method of mass producing the photovoltaic element of a large size and then dividing it by cutting according to the requirement, thereby providing the solar cell module of a low cost, without the necessity of originally producing the photovoltaic cell of each size. Also in such case, the production is managed by attaching ID to each unit of the photovoltaic element of a large size, which is the processing unit in the mass production.

FIGS. 1A to 1D show an example of the above-mentioned photovoltaic element provided with an ID, wherein FIG. 1A is a plan view thereof, FIG. 1B is a cross-sectional view along the line 1B—1B of FIG. 1A, FIG. 1C is a cross-sectional view along the line 1C—1C of FIG. 1A, and FIG. 1D is a bottom plan view thereof. A current-collecting electrode 102 formed on a semiconductor substrate 101 has a function of efficiently collecting the electric current generated in the semiconductor substrate 101. The current-collecting electrode 102 is formed by adhering with a carbon paste a copper wire, which is of a low cost and has a low resistance loss, to the element. A positive electrode lead terminal 103 has a function of collecting the current from the current-collecting electrode 102 and guiding the current to the exterior. It is composed of a silver-clad copper foil. The silver-clad copper foil is employed in order to reduce a contact resistance between the positive electrode lead terminal 103 and the current-collecting electrode 102 because of use of silver. The positive electrode lead terminal 103 is adhered onto a double-faced insulating adhesive tape 104 provided on the semiconductor substrate 101. A negative electrode lead electrode 105 has a function of collecting the electric current generated on the back surface of the semiconductor substrate 101 and guiding the current to the exterior. This negative electrode lead terminal is formed by laser welding a copper foil onto the semiconductor substrate 101. An ID 106 consists of a bar code printed by an ink jet method on the back surface of the semiconductor substrate 101, and records a production management number. The production management number has information including a production lot of the semiconductor substrate and a serial number within such lot.

In the following the function of the ID 106 will be explained in more details.

For the purpose of cost reduction, as explained in the foregoing, the photovoltaic element is always produced in a large size, and the photovoltaic element having a large size is then divided by cutting according to the necessity or is used in such large size. The ID 106 is individually provided in each photovoltaic element of such large size, constituting the unit of mass production, for achieving various managements. For example there are managed the production conditions of the photovoltaic element, such as production date or production lot, the lots of the used materials and the data of result of performance inspection.

The performance inspection for the photovoltaic element is generally executed in a final step of production in the mass producing apparatus and prior to the division by cutting. It is executed prior to the division by cutting because a performance inspection apparatus adaptable to the element of various sizes after the cutting is expensive and requires adjustments such as a change in the position of the probe contacts and a change in the measuring positions for each change of the size, thus leading to deterioration in productivity and an increase in the cost. Therefore, the good/bad judgment in the performance inspection step is executed in the unit of the photovoltaic element prior to the division by cutting, and the result of the performance inspection is stored and managed in one-to-one correspondence with the ID specific to the photovoltaic element prior to the division by cutting. Consequently, the four IDs shown in FIG. 1D are all the same and the data reading is executed on one of such four IDs.

At least one ID is provided on each area corresponding to the photovoltaic elements after division, in order to enable investigation of the production condition etc. of each photovoltaic element after division, even in case it is divided by cutting. In the example shown in FIGS. 1A to 1D, there are provided four IDs in consideration of cases where the photovoltaic element is divided along the line 1B—1B, along the line 1C—1C, or along the lines 1B—1B and 1C—1C of FIG. 1A. The Ids of the plurality of photovoltaic elements obtained by division are mutually all the same.

Also in the example shown in FIGS. 1A to 1D, the four IDs are printed with two ink jet printers, in order to obtain low-cost IDs within the tact time. The IDs positioned along the direction of the line 1C—1C in FIG. 1A, which is the conveying direction of the article to be processed (work) in the mass production apparatus, are printed by a same ink jet printer. Also, since the IDs are printed with two ink jet printers while the work is conveyed by a conveyor, the IDs are printed in positions parallel to the direction 1C—1C in FIG. 1A. Further, the four IDs are printed in symmetric positions in the vertical and lateral directions, in order that the bar code reader can achieve reading regardless of the placing direction of the work.

However, the article to be processed (for example, photovoltaic element) having ID as shown in FIGS. 1A to 1D has caused the following problems.

One of the causes of the performance defect in the photovoltaic element is the short circuit of the element, and the element often is scarred in the short circuit portion. Also a minor scar is sometimes found even in the photovoltaic element not causing short circuit, and may detrimentally affect the reliability of the element.

Such scar is estimated to be induced by a certain interference in the mass production apparatus, and to be generated in a specified position within the mass production apparatus, based on the position of such scar in the photovoltaic element. Thus the short circuit, which is one of the cases of the performance failure of the photovoltaic element, is significantly correlated with the processing position in the mass production apparatus or with the direction of the article to be processed at processing.

However, when the photovoltaic element is symmetrical in shape, it is not possible, after the production, to identify the direction of processing (such as formation of a semiconductor layer) of the photovoltaic element in the mass production apparatus. Also the ID contains the information on the production lot or on the production date, but does not contain the information on the processing position or direction in the mass production apparatus. For this reason, in trying to specify the step or cause of scar formation in the mass production apparatus, the identification of position of cause in the mass production apparatus is difficult and requires a long time. It is therefore not possible to achieve a feedback to the maintenance service of the mass production apparatus, thereby resulting in reduction of the production yield and a cost increase due to interruption of production.

Such problem becomes more serious in case the article to be processed is divided by cutting. For example, in case the photovoltaic element shown in FIGS. 1A to 1D is divided by cutting along the line 1B—1B or 1C—1C, the elements after cutting have the same shape. Also in case the photovoltaic element is divided into four by cutting along the lines 1B—1B and 1C—1C, the pieces after cutting can be classified into two types of shape, but each type contains two pieces. Therefore, if the element is scarred in the mass production apparatus and the scarred photovoltaic elements corresponding to the scar-causing position of the apparatus have to be selected out and discarded, it is not easy to select such elements. Consequently there may cause a situation where all the elements to be subjected to such selection have to be discarded, thereby resulting in significant reduction of the production yield and increase in the cost.

In order to avoid such problems, it is conceivable to add the information on the position or direction of processing to the ID, in addition to the production lot and production condition, or to add another ID including only the position information at processing, in addition to the aforementioned ID.

However, the ID already contains information on the production lot, production apparatus and serial number, and the number of digits, for example, of the bar code has to be increased in order to add the information on position and direction of processing. The number of digits in the ordinary bar code is however limited, and an increase in the number of digits complicates the ID and increases the reading errors, so that a high-performance bar code printing system of expensive specifications must be employed in order to accommodate the increase of the number of digits. Also in case of forming an additional ID for the information on position and direction of processing, there is similarly required a new bar code printing system, and the bar code reader has also to be prepared newly. Also for accommodating the increase in the number of digits of the bar code, it is required to change the software of the ID management system and the measuring program of the performance inspection step. In either case, the management system becomes significantly complex and the increase in cost is unavoidable.

On the other hand, the information on the position or direction of the article to be processed at processing is not necessary when the production is stable without trouble, and such information will become useless when the production condition becomes stable in the future. It is considered that inclusion of such information in the ID causes a mere complication of the system with an increase in the cost.

SUMMARY OF THE INVENTION

The object of the present invention is to collectively or individually resolve the above-mentioned problems. More specifically, the object of the present invention is to provide an article to be processed and a method of producing the article, enabling prompt resolution of a trouble in the production process and also enabling appropriate selection of the article even after the article is divided by cutting.

The above-mentioned object can be attained, according to the present invention, by an article to be processed comprising a plurality of Ids having the same information for machine reading but at least two kinds of external appearances which are visually different from each other.

Further, the preferred features of the article to be processed of the present invention are as follows.

It is preferable that the plurality of IDs can be visually confirmed by difference in at least one of color, shape and size thereof.

The positional relationship of the plurality of IDs is preferably information corresponding to the direction or position of the article to be processed in the mass production apparatus.

The ID is preferably a bar code.

The ID is preferably printed with ink.

The ID preferably includes a production management number.

The article to be processed is preferably a semiconductor element.

The semiconductor element is preferably a photovoltaic element.

The article to be processed preferably has a symmetrical shape.

The article to be processed is preferably subjected to division by cutting.

The plurality of IDs are preferably provided so that at least one ID is provided on each of the articles to be processed after division by cutting.

The present invention also provides a method of producing an article to be processed, comprising a step of forming, on an article to be processed, a plurality of IDs having the same information for machine reading but at least two kinds of external differences which are visually different from each other.

Further, the preferred features of the method of producing an article to be processed according to the present invention are as follows.

The article preferably has a symmetrical shape and the method preferably further comprises a conveying step involving a change in direction.

The article preferably is a semiconductor element, and the ID is preferably formed after a film forming step.

The article is preferably a photovoltaic element and the ID is preferably formed after a semiconductor layer forming step.

The method preferably further comprises an ID reading step, and, in case a reading error for the ID is detected, the recovery for the reading error is preferably executed by reading an adjacent ID.

The article is preferably subjected to division by cutting, and the plurality of IDs are preferably provided so that at least one ID is provided on each of the article after division by cutting.

According to the present invention, since the plurality of IDs provided on the article have the same information for machine reading, there is only required a change in the printing means for the ID and new addition of information to the ID itself is not required. Consequently, a new investment for the equipment is not necessary. On the other hand, since the difference in the plurality of IDs can be confirmed visually, the personnel at the production site can identify, in case of a trouble, the position or direction of the article in the mass production apparatus from the positional relationship of the plurality of IDs.

It is thus rendered possible, in analyzing the cause of a trouble, to identify the position or direction of the article in the apparatus, and to accordingly specify a location in the apparatus where the trouble tends to be generated in the apparatus, whereby the prompt recovery of the apparatus by maintenance is possible. It is also rendered possible to execute selection of the articles depending on the position in the mass production apparatus, even after the division by cutting. It is thus rendered possible to improve the production yield of the photovoltaic elements, thereby reducing the cost thereof.

Also the visual difference in the external appearance of the plurality of IDs can be realized, for example, by changing the color or print size of the bar code and can be achieved, in an already existing ink jet printer for printing the bar code, merely by changing the print size setting or the ink color, so that the aforementioned effects can be attained with a low cost without the new investment in the bar code printing system or in the bar code reader.

Also the plurality of IDs are provided primarily for confirming the management of the production condition at the division and for executing the ID reading regardless of the direction of charging the article to be processed in the mass production apparatus. However, the ID reading is often influenced by the ambient environment, and may result in a reading error depending on the environment. In such case, the present invention executes reading an adjacent another ID which can be visually confirmed as a different ID, thereby enabling reading, for example, by a change in the reading angle resulting from a difference in the size, and thus completely avoiding a situation where the production apparatus is stopped by an ID reading error.

Other features and advantages of the present invention will become apparent from the following description which is to be taken in conjunction with the accompanying drawings.

DETAILED DESCRIPTION OF THE PREFERRED EMBODIMENTS

Figure 1A:
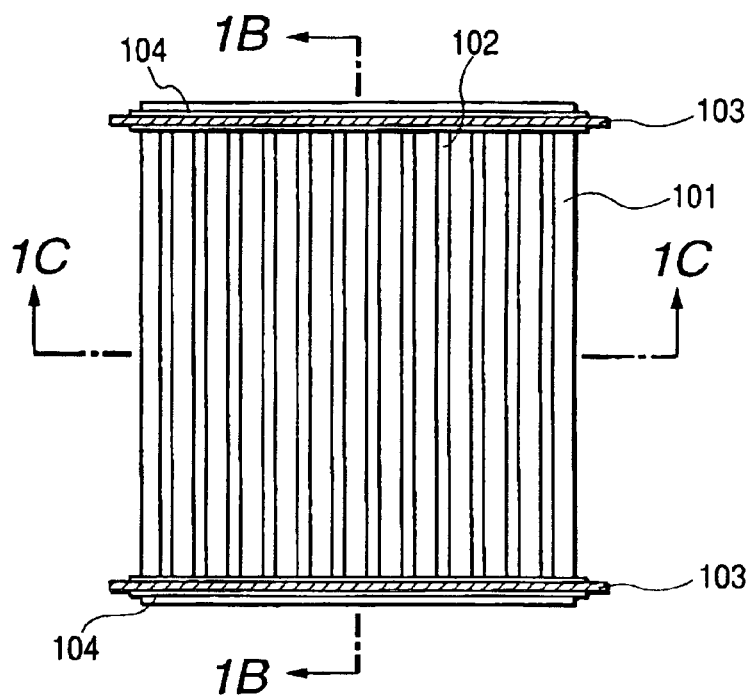
FIG. 1A is a top plan view of a photovoltaic element.
Figure 1B:
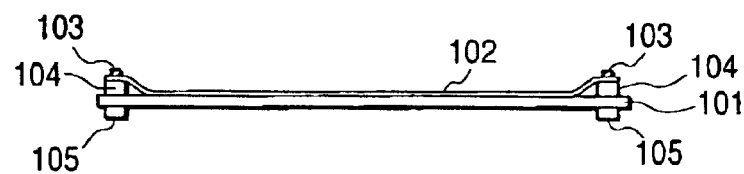
FIG. 1B is a cross-sectional view taken along the line 1B—1B of FIG. 1A.
Figure 1C:
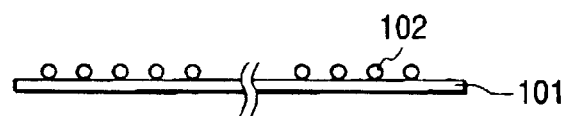
FIG. 1C is a cross-sectional view taken along the line 1C—1C of FIG. 1A.
Figure 1D:
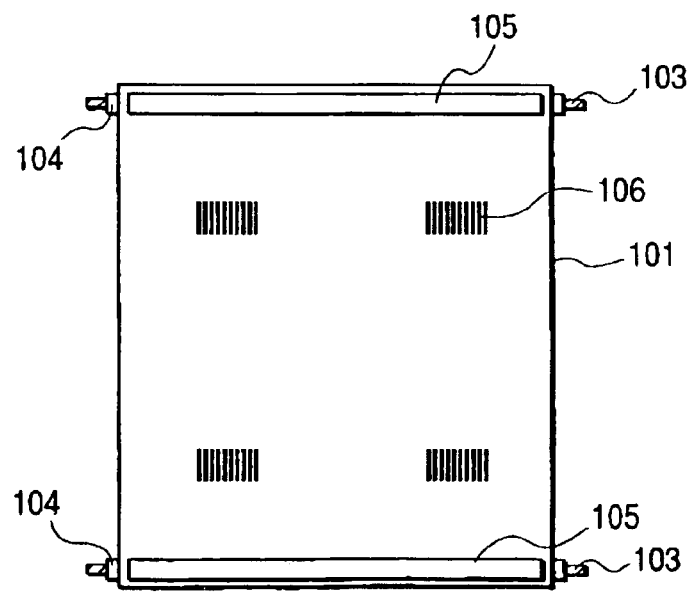
FIG. 1D is a bottom plan view of the photovoltaic element shown in FIG. 1A.

Now the present invention will be clarified in detail by embodiments thereof.

The present invention is to provide an article to be processed comprising a plurality of IDs having the same information for machine reading but at least two kinds of external appearances which are visually different from each other, and producing method therefor, and the components therein will be explained in the following.

(Article to be Processed)

The article to be processed of the present invention is not particularly limited a material thereof or a processing method thereof, but includes those produced under production process management, such as plastic products produced in a molding process, foods produced in a preparing process, semiconductor elements produced in semiconductor film forming and mounting processes, metal components formed in a pressing process, and ceramic components produced in sintering and mounting processes. Also the article to be processed may be a product itself or a component thereof. For example, it may be a photosensitive member unit of a copying apparatus, or a photovoltaic element of a solar cell module.

Among these, the effect of the present invention is more conspicuously exhibited in a semiconductor element such as a photovoltaic element, since the management of the processing position of the semiconductor element in the mass production apparatus is required because the production of the semiconductor element has a large number of process steps and complex production conditions.

(ID)

The ID in the present invention is not particularly limited as long as machine reading is possible, and includes for example a symbol, a character and a bar code. Also the method of machine reading is not particularly limited, and can be achieved for example by an image processing software or a bar code reader for emitting laser light and reading the reflected light, but there is preferred a bar code which is capable of inexpensively realizing a management system utilizing a computer.

The method for forming ID is not particularly limited, and for example includes a method of printing with a diamond cutter, a laser printing method of printing by focusing a laser light, a printing method with an ion beam, a method of forming an ID on a label and adhering such ID on the article to be processed, and an ink jet recording method. Among them the method of ink jet printing directly on the article to be processed is inexpensive and provides a large cost advantage.

Also the information contained in the ID may include, for example, production management information such as information of production lot, information of production date, a product number or a part number, and information on the result of performance inspection of the article, but such examples are not restrictive and it is preferable, in consideration of the investment in the equipment, to include the minimum necessary information for the mass production.

The print position of each ID is not particularly limited, but is desirably such a position enabling the reading operation by a machine (reading apparatus) without being influenced by the charging direction into the mass production apparatus, and is more preferably selected parallel to the conveying direction of the processing line, since an ink jet printer can print a plurality of Ids, thereby providing a high cost advantage.

(Symmetrical Shape)

The present invention provides a more remarkably effect when the article to be processed has a symmetrical shape. The symmetrical shape includes not only a circular, rectangular and square shapes but also any shape which is line, point or plane symmetrical. In case of obtaining a photovoltaic element of a smaller size from a photovoltaic element of a larger size, when the photovoltaic element of the larger size has a symmetrical shape, there can be obtained photovoltaic elements of the smaller size in the same shape by cutting, thereby providing a high productivity.

(IDs Having Difference Which can be Visually Confirmed)

In the present invention, the plurality of IDs having difference which can be visually confirmed means IDs having external appearances which are different each other and includes IDs having differences which can be confirmed visually, for example, by difference in color, shape or size, but the difference in color or size is preferred because difference can be visually confirmed with ease.

Also the arrangement of the IDs having difference which can be visually confirmed within the article preferably corresponds to the positional relationship of the respective processing apparatus in which the article is to be charged, but such arrangement only requires a certain rule and is not limited to certain particular arrangements.

(Photovoltaic Element)

Figure 2A:
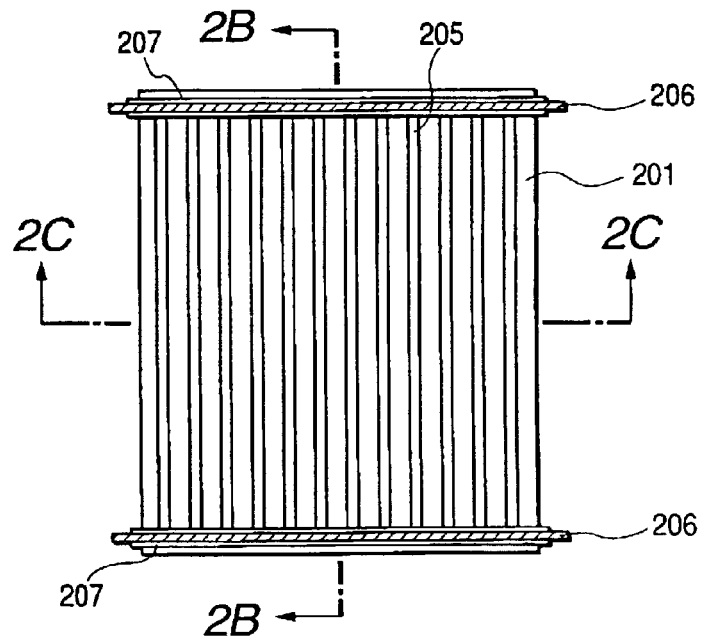
FIG. 2A is a top plan view of a photovoltaic element according to an embodiment of the article to be processed article having ID of the present invention.
Figure 2B:
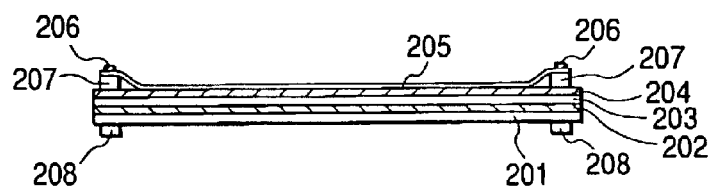
FIG. 2B is a cross-sectional view taken along the line 2B—2B of FIG. 2A.
Figure 2C:
FIG. 2C is a cross-sectional view taken along the line 2C—2C of FIG. 2A.
Figure 2D:
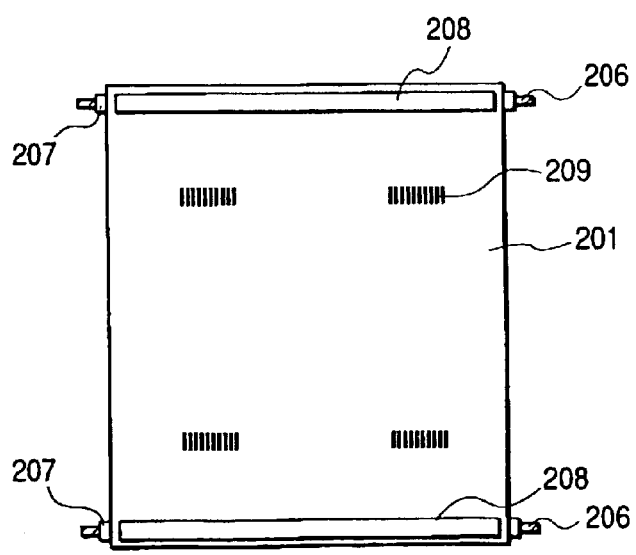
FIG. 2D is a bottom plan view of the photovoltaic element shown in FIG. 2A.

The photovoltaic element as the article to be processed of the present invention is not particularly limited, but is preferably one comprising thin film semiconductors, which is of a low cost and allows easy division by cutting. FIGS. 2A to 2D show an embodiment of the photovoltaic element in the present invention, wherein FIG. 2A is a plan view thereof, FIG. 2B is a cross-sectional view taken along the line 2B—2B of FIG. 2A, FIG. 2C is a cross-sectional view taken along the line 2C—2C of FIG. 2A, and FIG. 2D is a bottom plan view thereof. Referring to FIGS. 2A to 2D, there are shown a substrate 201, a back reflection layer 202, a semiconductor layer 203, a transparent electrode layer 204, a current-collecting electrode 205, a positive electrode lead terminal 206, an insulating double-sticking tape 207, a negative electrode lead terminal 208 and IDs 209. The ID is constructed similarly as explained in the foregoing. For example, the plurality of ID 209 may be made different in the external appearance by employing mutually different colors.

The substrate 201 can be composed, for example, a metal, a resinous material, glass, a ceramic material or a bulk semiconductor material. The substrate may be provided with fine irregularities on the surface. Also a transparent substrate may be adopted to achieve a configuration in which the light enters from the substrate side.

However, in case the semiconductor layer 203 is composed of a flexible substance such as amorphous silicon, also the substrate 201 is preferably composed of a flexible material in order to fully exploit the advantage of such flexibility. More specifically it is preferably composed of a metal or a resinous material, which can be formed into a continuous web shape to enable continuous film formation. Examples of the material for the resinous substrate include polyethylene terephthalate, polyethylene naphthalate, aromatic polyester, aromatic polyamide, polysulfonic acid, polyimide, polyallylate, and polyetherketone.

More preferably, the substrate 201 is composed of an electroconductive substrate, since it can also serve as the back electrode of the photovoltaic element. Examples of the conductive substrate include silicon, tantalum, molybdenum, tungsten, stainless steel, aluminum, copper, titanium, a carbon sheet, a zinc-plated steel plate, and a resinous film or a ceramic material on which a conductive layer is formed.

On the aforementioned substrate 201, a metal layer and/or a metal oxide layer may be formed as the back reflection layer 202. Such layer or layers serve to reflect the light reached to the substrate, for re-utilization in the semiconductor layer 203. Such layer or layers may be provided with surface irregularities to extend the optical path length of the reflected light in the semiconductor layer 202, thereby increasing the short circuit current. The metal layer can be composed, for example, of Ti, Cr, Mo, W, Al, Ag, Ni, Cu or Au while the metal oxide layer can be composed, for example, of $ZnO$, $TiO_2$ or $SnO_2$. The above-mentioned metal layer and metal oxide layer can be formed, for example, by resistance-heating vapor deposition, electron beam vapor deposition, sputtering, electroplating or printing.

The semiconductor layer 203 is not particularly limited and can be composed, for example, of pn-junction type polycrystalline silicon, pin-junction type amorphous silicon or a compound semiconductor such as $CuInSe_2$, $CuInS_2$, GaAs, $CdS/Cu_2S$, CdS/CdTe, CdS/InP, or $CdTe/Cu_2Te$. The semiconductor layer can be formed, in case of polycrystalline amorphous silicon, for example by sheet formation of fused silicon or thermal treatment of amorphous silicon, also in case of amorphous silicon, for example by microwave plasma CVD or high frequency plasma CVD utilizing silane gas, etc. as the raw material, and, in case of a compound semiconductor, by ion plating, ion beam deposition, vacuum deposition, sputtering or electrodeposition.

The transparent electrode layer 204 serves as an electrode of the photovoltaic element at the light receiving surface side. At the same time, it can also serve to increase the random reflection of the incident light and the reflected light, thereby extending the optical path length in the semiconductor layer 202. It can also serve to prevent diffusion or migration of the metal element of the current-collecting electrode 205 into the semiconductor layer 203 which induces the shunt of the photovoltaic element. It can also be provided with a suitable electrical resistance, thereby preventing short circuit resulting from a defect such as a pinhole in the semiconductor layer 203. The transparent electrode layer 204 preferably has a shunt resistance of $10^{-5}$ Ωcm or more but $10^{-2}$ Ωcm or less, and preferably has irregularities on the surface. It is composed, for example, of $In_2O_3$, $SnO_2$, $In_2O_3$—$SnO_2$ (ITO), ZnO, $TiO_2$, $Cd_2SnO_4$ or a crystalline semiconductor layer doped with an impurity at a high concentration, and can be formed, for example, by resistance-heating vapor deposition, sputtering, spray coating, CVD or impurity diffusion.

On the transparent electrode layer 204, the current-collecting electrode 205 is preferably formed for efficient current collection. Examples of the material constituting the current-collecting electrode 205 include Ti, Cr, Mo, W, Al, Ag, Ni, Cu, Sn or conductive paste such as silver paste. The current-collecting electrode 205 can be formed, for example, by sputtering, resistance-heating vapor deposition or CVD utilizing a mask pattern, a patterning method of depositing a metal film on the entire surface and eliminating unnecessary portions by etching, a method of directly forming a grid electrode pattern by photo CVD, a plating method after formation of a negative pattern of the grid electrode pattern, and a method of printing conductive paste. The conductive paste is usually composed of dispersion of finely powdered silver, gold, copper, nickel or carbon in a polymer binder material. Examples of such polymer binder include polyester resin, epoxy resin, acrylic resin, alkyd resin, polyvinyl acetate, rubber, urethane resin, and phenolic resin.

In order to gather the current collected by the current-collecting electrode 205 and to guide the current to the exterior of the photovoltaic element, there are provided the positive electrode lead terminal 206 and the negative electrode lead terminal 208. The negative electrode lead terminal 208 is preferably formed by adjoining a metal member such as a copper tab to the substrate 201 by spot welding or by soldering, and the positive electrode lead terminal 206 is preferably formed by electrically connecting a metal member to the current-collecting electrode 205 with conductive paste or with solder. In mounting the positive electrode lead terminal 206 to the current-collecting electrode 205, the double-sticking insulating tape 207 is preferably provided in order to avoid short circuit to be caused by the contact of the positive electrode lead electrode 206 with the substrate 201 or the semiconductor layer 203.

Also the photovoltaic element may be provided with a protective layer (not shown) formed, for example, by coating a transparent paint, in order to protect the photovoltaic element from the external damage.

Furthermore, the photovoltaic element may be divided by cutting according to the necessity to form smaller photovoltaic elements. In such case, the photovoltaic element may be divided into any number, and it is preferable to eliminate in advance the transparent electrode layer in the cutting portion, in order to avoid short circuit between the transparent electrode layer 204 in the cutting portion and the conductive substrate 201, and to provide an insulating material (not shown) between the current-collecting electrode 205 in the cutting portion and the transparent electrode layer 204 in order to avoid short circuit between the current-collecting electrode 205 and the conductive substrate 201. In such case, the insulating material is not particularly limited, but is preferably composed of a PET tape or the like because it is relatively inexpensive.

(Dividing Process by Cutting)

The dividing process by cutting in the present invention is not particularly limited in its method, as long as the article to be processed is divided by cutting in the course of the production process. The article may be divided into two, three or any arbitrary number, and may be divided into equal or unequal portions. Also the cutting method is not particularly limited and may be achieved for example with a shearing machine, a pressing machine, an electric saw, a water jet machine or a laser cutting machine, but an inexpensive pressing machine is preferably employed in providing a photovoltaic element of a low cost.

The present invention is also effective even in case the dividing process by cutting is not executed, since there can be identified the direction of processing of the photovoltaic element of a large size in the production apparatus.

In the following there will be explained examples of the present invention, but, the present invention is by no means limited by such following examples.

EXAMPLE 1

The present example provides a photovoltaic element having an amorphous semiconductor film, which is divided into two by cutting after discharged from the mass production apparatus. The photovoltaic element is symmetrical in the vertical and lateral directions, and is provided with 4 IDs. The visual difference in size of the ID (in external appearance) allows to confirm the direction in the mass production apparatus, and also the position therein even after the division by cutting.

Figure 3A:
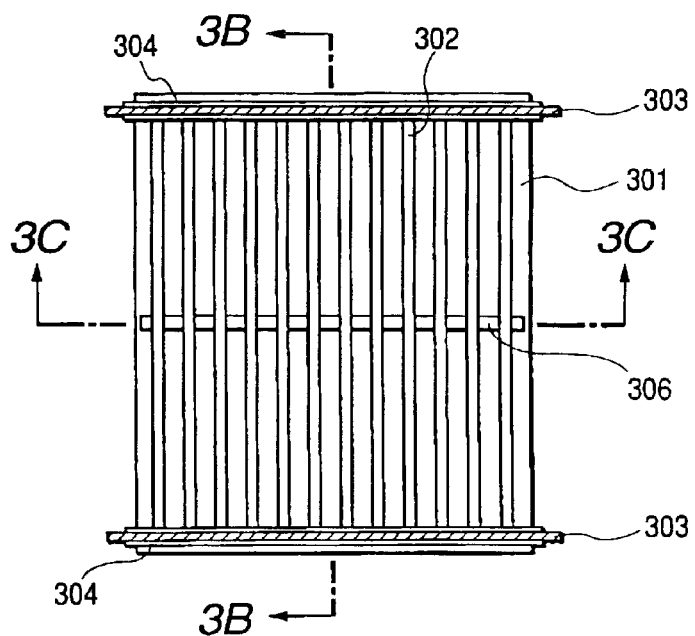
FIG. 3A is a top plan view of a photovoltaic element of Example 1.
Figure 3B:
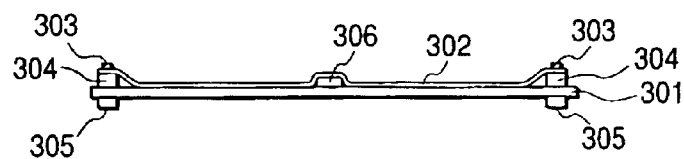
FIG. 3B is a cross-sectional view taken along the line 3B—3B of FIG. 3A.
Figure 3C:
FIG. 3C is a cross-sectional view taken along the line 3C—3C of FIG. 3A.
Figure 3D:
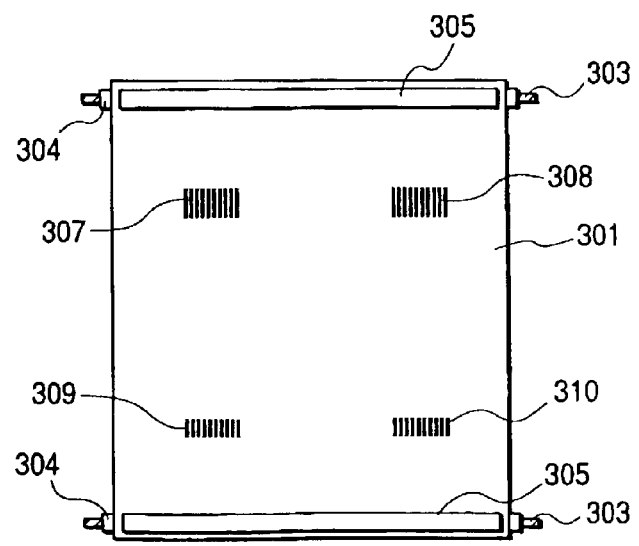
FIG. 3D is a bottom plan view of the photovoltaic element shown in FIG. 3A.

FIGS. 3A to 3E show the photovoltaic element of the present example, wherein FIG. 3A is a top plan view thereof, FIG. 3B is a cross-sectional view taken along the line 3B—3B of FIG. 3A, FIG. 3C is a cross-sectional view taken along the line 3C—3C of FIG. 3A, and FIG. 3D is a bottom plan view therof. In FIGS. 3A to 3E, there are shown a semiconductor substrate 301, a current-collecting electrode 302, a positive elctrode lead terminal 303, a double-sticking insulating tape 304, a negative electrode lead terminal 305, an insulating tape 306 for division, and IDs 307, 308, 309 and 310.

In the following there will be given a detailed explanation on the role of these components and the producing methods thereof, with reference to the accompanying drawings.

Figure 4A:
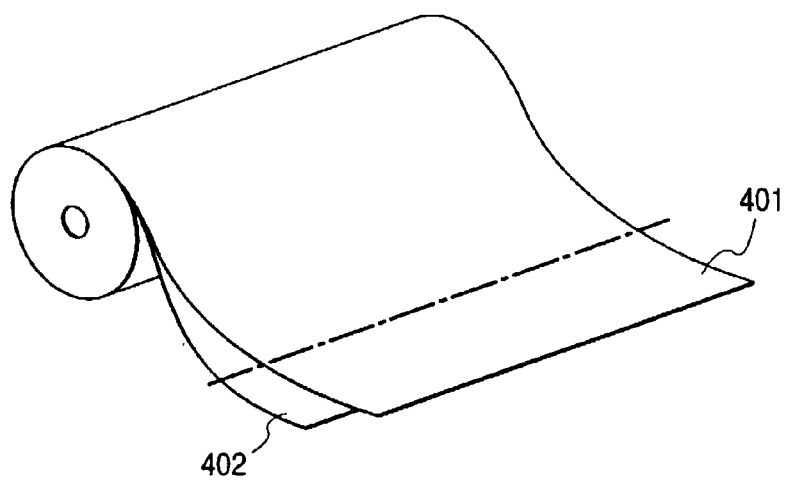
FIGS. 4A and 4B are respectively a perspective view of a semiconductor substrate in a roll shape according to Example 1 in a roll shape and a cross-sectional view of the roll-shaped semiconductor substrate 401.
Figure 4B:
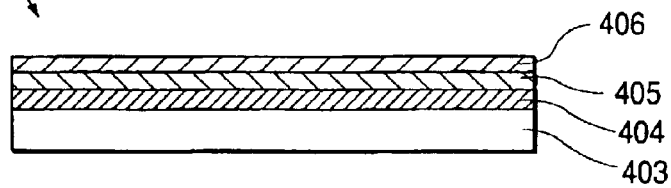

FIGS. 4A and 4B are respectively a perspective view and a cross-sectional view showing a semiconductor substrate of roll shape of the present example. The semiconductor substrate 401 is rolled with an interleaving paper 402, and is composed, on a flexible substrate 403, of a back reflection layer 404, a semiconductor layer 405 and a transparent electrode layer 406. More specifically, the flexible substrate 403 is composed of a conductive material such as stainless steel, and serves as an electrode layer at the back surface side. The back reflection layer 404 is composed of an aluminum layer and a zinc oxide layer, and is formed by sputtering. The semiconductor layer 405 has a triple-layered structure of n, i and p type amorphous silicon semiconductor films in the order from the substrate side, and is formed by CVD. The transparent electrode layer 406 serves as an electrode at the light receiving surface side and is formed by sputtering.

Figure 5:
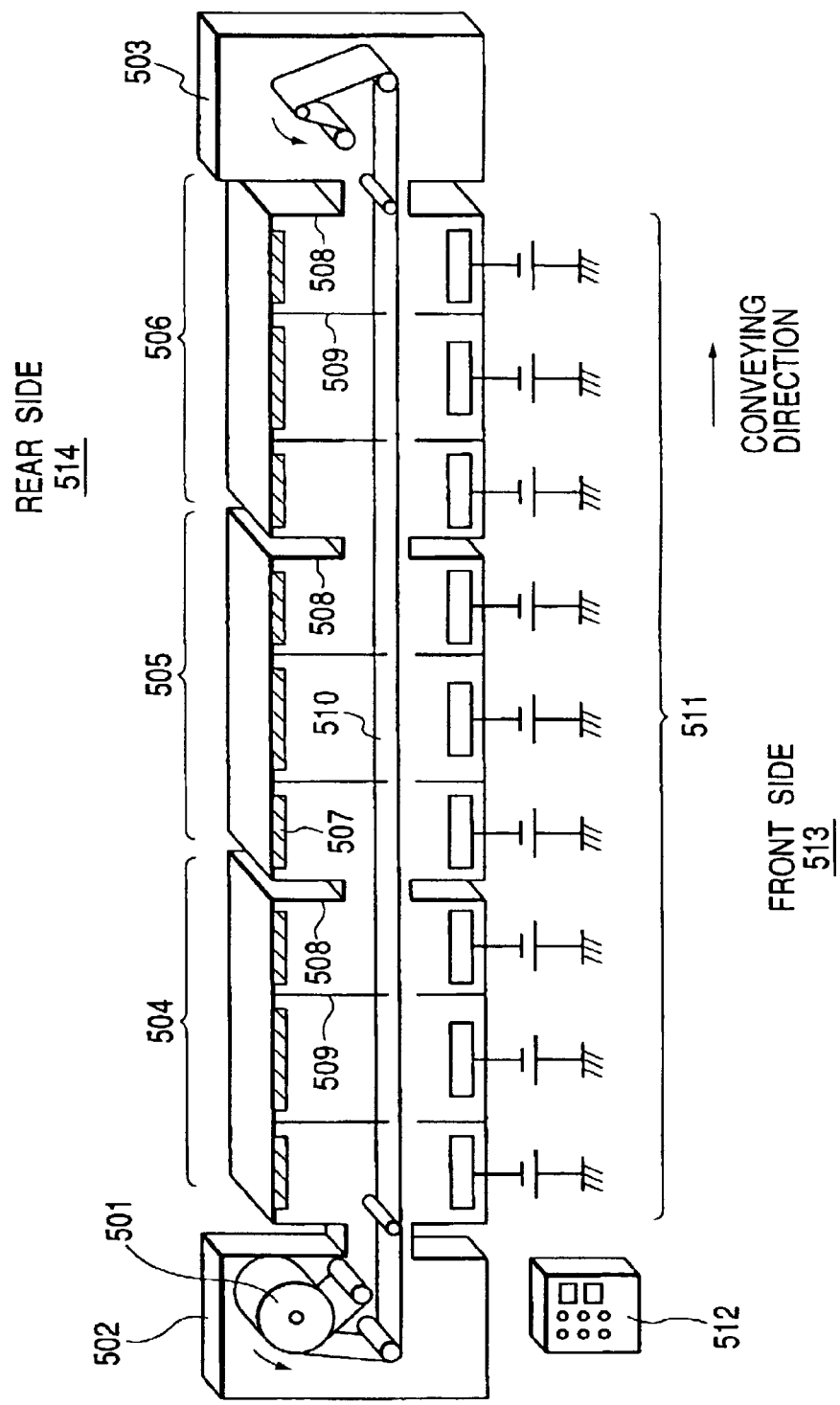
FIG. 5 is a schematic view of a production apparatus of Example 1 for forming a continuous film by a roll-to-roll method.

FIG. 5 is a schematic view of a production apparatus of the present example, for continuous film formation by a roll-to-roll system.

This apparatus is used for film formation of the back reflection layer 404, the semiconductor layer 405 and the transparent electrode layer 406, but, in the following, there will be explained the procedure of formation of the semiconductor layer 405 as an example.

(1) A rolled substrate 501 is mounted in an unwinding chamber 502, and is extracted and passed to a winding chamber 503 and is set therein.

(2) Processing chambers 504, 505, 506 are evacuated by a vacuum pump (not shown), and inert gas and raw material gasses such as hydrogen, silane gas, phosphine gas, etc. are introduced at predetermined flow rates to adjust the interior of the process chambers 504, 505, 506 to predetermined pressures.

(3) In the processing chambers 504, 505, 506, an internal wall 508 of the apparatus, a partition plate 509 and the flexible substrate 510 are adjusted to a film forming temperature with a heater unit 507 and a temperature sensor (not shown).

(4) In the processing chambers 504, 505, 506, an electric power is supplied from a power supply unit 511 to generate an electric field by microwave or RF discharge, and the conveying operation of the substrate 510 is started.

(5) The substrate 510 is conveyed in continuous manner at a constant speed, and n, i and p type amorphous silicon semiconductor films are formed by CVD onto the substrate 510 in the processing chambers 504, 505, 506, respectively.

(6) The semiconductor layer is formed over the entire length of the roll, and, when the conveying of the substrate is completed, the rolled substrate is taken out from the winding chamber 503.

In the following description, a side of the apparatus having an operation panel 512 will be called a front side 513 of the apparatus, while a side without the operation panel 512 will be called a rear side 514.

A roll-shaped semiconductor substrate is obtained in the above-described manner. In the following there will be explained a procedure of preparing, from the aforementioned roll-shaped semiconductor substrate, a photovoltaic element as shown in FIGS. 3A to 3E.

Figure 6:
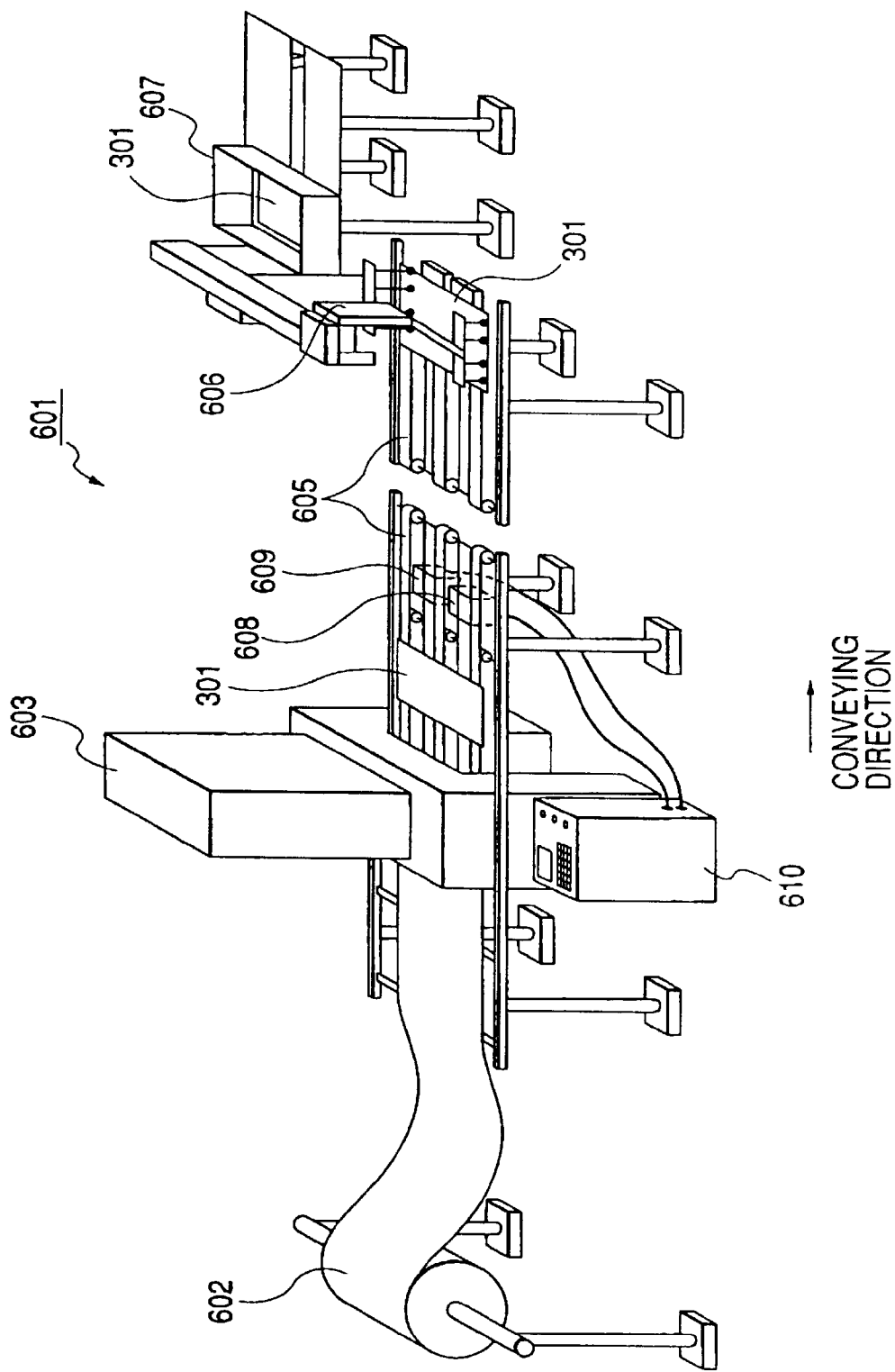
FIG. 6 is a schematic view of a slab cutting apparatus of Example 1.

FIG. 6 is a schematic view of a slab cutting apparatus of the present example, wherein the roll-shaped semiconductor substrate 602 is cut into slabs at a pitch of 240 mm. Because of a roll width of 356 mm, the cut semiconductor substrate 301 is a rectangular slab of 240 mm×356 mm, which is conveyed by a conveyor 605 and is stored by a suction hand 606 into a container box 607.

Immediately after cutting into the slab, IDs are printed on the back surface of the semiconductor substrate 301. In the following there will be explained the method of printing the IDs 307, 308, 309, 310 shown in FIGS. 3A to 3E.

The IDs 307, 308, 309, 310 are printed by detecting the semiconductor substrate 301 with a reflective sensor and by jetting ink from two ink jet bar code printers 608 and 609 provided between the conveyors 605.

The IDs 307, 308, 309, 310 are printed in four positions on the back side of the semiconductor substrate 301, and have the same information for machine reading. The IDs utilize all of 10 digits which are maximum digits available in the bar code printing system, and, within such 10 digits, 2 digits are assigned to the year, 3 digits to the film forming lot number of the semiconductor layer, 1 digit to the number indicating the film forming apparatus and 4 digits to the serial number of each semiconductor substrate after slab cutting. Also the four IDs 307, 308, 309, 310 are printed with the two bar code printers 607, 608 in order to achieve printing within the tact time of the slab cutting apparatus. More specifically, the IDs 307 and 308 positioned along the conveying direction of the semiconductor substrate 301 are printed by the bar code printer 608, while the IDs 309 and 310 are printed by the bar code printer 609. The bar code printers 608 and 609 respectively communicate with the operation panel 610 of the slab cutting apparatus, and the bar code printing is achieved by entering the year, production lot number of semiconductor layer and number indicating the film forming apparatus from the operation panel 610 and by increasing the serial number in the order of cutting of the semiconductor substrate 602 with the pressing machine 603.

In this operation, the bar code printers 608 and 609 provide different print sizes, whereby the IDs 307, 308 and the IDs 309, 310 are made visually different. In the present example, in the processing chambers of the mass production apparatus for the semiconductor layer, the IDs 307, 308 of a larger size are printed at the front side of the apparatus (front side in FIG. 5) while the IDs 309, 310 of a smaller size are printed at the rear side of the apparatus (rear side in FIG. 5).

The IDs are printed immediately after the formation of the semiconductor layer and the slab cutting, because, in case the article to be processed is a photovoltaic element, the position in the processing chambers for film formation such as of the semiconductor layer affects most significantly the scars or the like on the element, and also because the semiconductor substrate after slab cutting process becomes a rectangular slab and the direction or position in the film forming step in the production apparatus is no longer identifiable if the element thereafter is subjected to processing steps involving a directional change step. In the predetermined step, the printing of the aforementioned IDs allows to identify the position of the semiconductor layer in the film forming apparatus even after a step involving a directional change.

The semiconductor substrate 301 cut into rectangular shape is charged into an automatic mounting line, which is an automatic line with a tact time of 10 seconds, consisting of about 10 steps. When the container box 607 containing semiconductor substrates 301 of slab shape is manually set on the automatic mounting line, the work (semiconductor substrate 301) is automatically taken out from the container box 607 and charged into the line one by one. Thereafter, the semiconductor substrate is subjected to partial elimination of the transparent electrode layer by etching in order to separate the electricity-generating area, then to passivation for repairing a defect portion or a short circuit portion in the semiconductor layer of the semiconductor substrate, and to the formation of a dividing tape 306 for cutting, a double-sticking insulating tape 304, a current-collecting electrode 302, a positive electrode lead terminal 303 and a negative electrode lead terminal 305, whereby the photovoltaic element 300 is completed (cf. FIGS. 3A to 3E).

The current-collecting electrode 302 has a role of efficiently collecting the electric current generated in the semiconductor substrate 301, and was formed by adhering a copper wire of low cost having a low resistance loss to the element with carbon paste. The positive electrode lead terminal 303 has a role of collecting the electric current from the current-collecting electrode 302 and guiding the current to the exterior, and was composed of a silver-clad copper foil. The silver-clad copper foil was employed in order to reduce the contact resistance between the current-collecting electrode 302 and the positive electrode lead terminal 303 by the use of silver. The positive electrode lead terminal 303 was formed by adhering on the double-sticking insulating tape 304 provided on the semiconductor substrate 301. The negative electrode lead terminal 305 has a role of collecting the electric current generated on the back surface of the semiconductor substrate 301 and guiding the current to the exterior, and was formed by laser welding a copper foil onto the semiconductor substrate 301.

In the present example, a dividing insulating tape 306 is provided for further dividing the photovoltaic element 300 into a half. In a dividing portion by cutting, the transparent electrode layer (not shown) of the semiconductor substrate 301 is removed in advance, and the dividing insulating tape 306 is adhered on such portion, thereby preventing short circuit between the current-collecting electrode 302 and the semiconductor substrate 301 at the dividing operation. The dividing insulating tape 306 consisted of a PET tape of a thickness of 130 $\mu$m.

The final step in the automatic mounting line is a performance inspection step for measuring the characteristics of the photovoltaic element 300. In this step, the photovoltaic element 300 is subjected to irradiation with light and the generated output is measured to determine the photoelectric conversion efficiency, thereby judging whether the element passes or does not pass the test.

Figure 7:
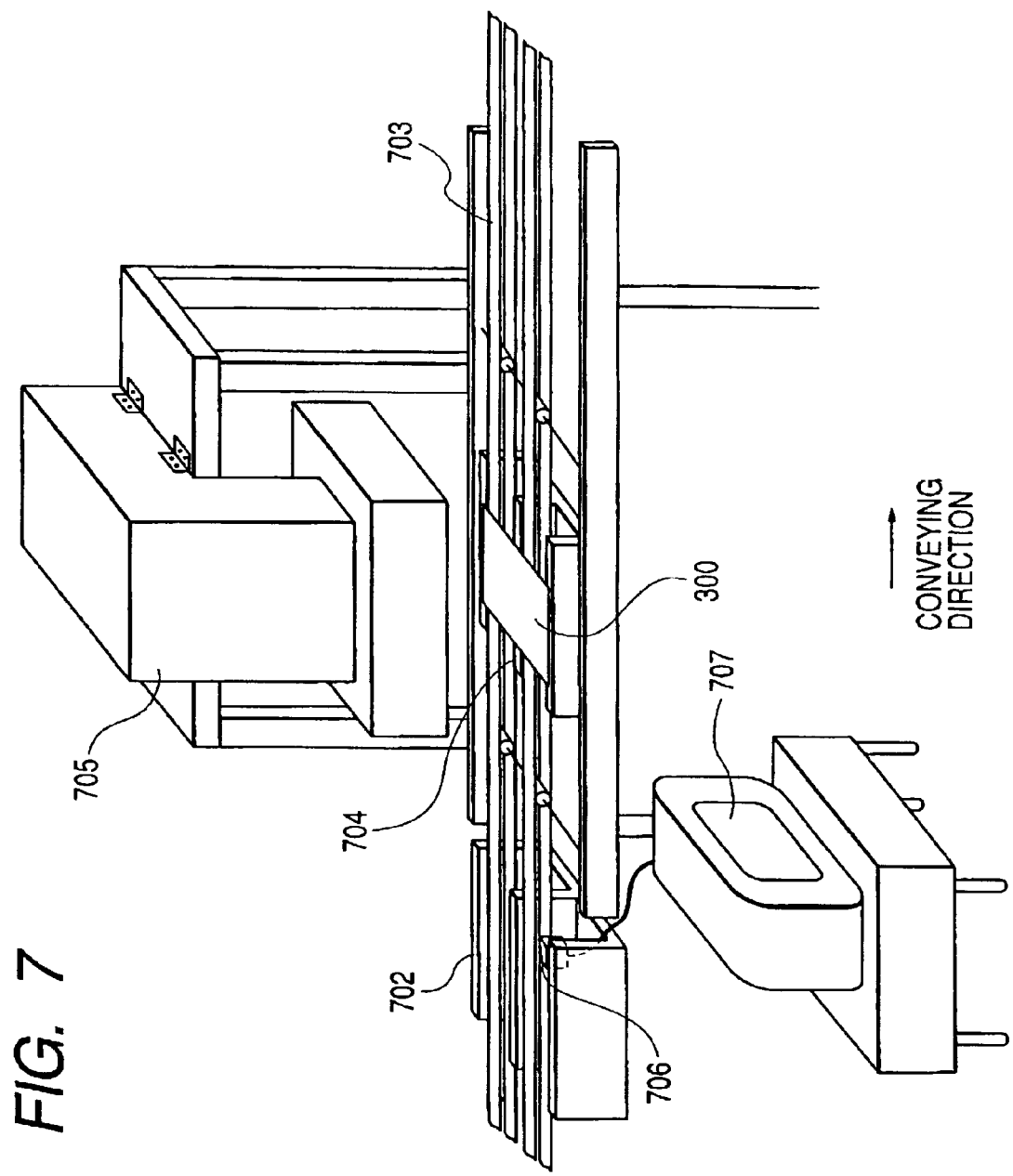
FIG. 7 is a schematic view of a performance inspection step in an automatic mounting line of Example 1.

The performance inspection step will be explained with reference to the accompanying drawings. FIG. 7 is a schematic view showing the performance inspection step of the automatic mounting line of the present example. The photovoltaic element 300 is transferred onto a conveyor 703 by the descent of a waiting stage 702 in response to a measurement start signal of a measurement program, and is subsequently conveyed to a measurement stage 704 by the conveyor 703. Upon detecting the photovoltaic element 300 by a sensor, the measurement stage 704 is elevated to a measuring height, whereupon the measurement of the performance is initiated. The measurement is achieved by determining the output (watts) of the photovoltaic element 300 when irradiated with a predetermined light amount by an irradiating apparatus 705.

Under the waiting stage 702, there is provided one bar code reader 706, which reads the ID on the back side of the photovoltaic element 300, and the read information is stored in a personal computer 707, together with the result of performance measurement. The bar code reader reads one of the IDs 307, 308, 309, 310 provided on the back surface of the photovoltaic element 300. The four IDs 307, 308, 309, 310 are printed at the same distance from an end portion of the semiconductor substrate 301 and parallel to such end portion, in order to enable reading by the bar code reader regardless of the direction of the photovoltaic element 300.

Figure 3E:
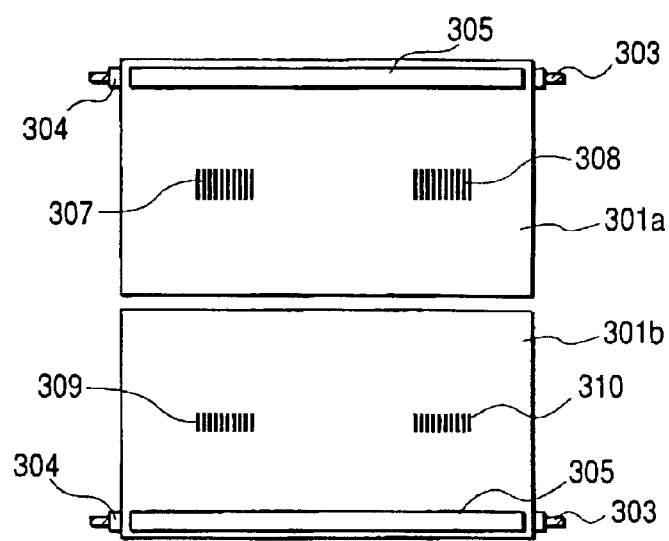
FIG. 3E is a bottom plan view of photovoltaic elements 301a and 301b after cutting of the photovoltaic element 301 shown in FIG. 3A along the line 3C—3C.

The photovoltaic element 300 coming out of the mass production apparatus is subjected further to the division by cutting in a cutting machine. The cutting machine is provided separately and is operated manually. After manual positioning of the photovoltaic element 300, a button is depressed to achieve cutting by pressing with a shearing blade along a portion 3C—3C in FIG. 3A. In such case, the two photovoltaic elements 301a, 301b after division by cutting have the same shape as shown in FIG. 3E, but the observation of the ID on the back side allows to identify the position of the semiconductor layer at the front or rear side of the apparatus for forming the semiconductor layer. More specifically, it is possible to identify whether either shorter side of the photovoltaic element 300 prior to division by cutting was positioned at the front or rear side of the semiconductor film forming apparatus shown in FIG. 5. Also by observing the bar codes printed on the element after division by cutting, it is possible to identify that the photovoltaic element 301a having the larger bar code 308 was conveyed in the front side of the semiconductor layer forming apparatus, and that the photovoltaic element 301b having the smaller bar code 310 was conveyed in the rear side of the apparatus. In the present example, since the element is not changed in direction in the film forming process, if the position of the element after division (or the direction of the element prior to division in the apparatus) is known in the semiconductor film forming apparatus, there can be derived the position of the element after division in other film forming apparatus, based on the structure thereof.

The photovoltaic element of the present example is symmetrical in shape, but the direction in the mass production apparatus can be confirmed from the positional relationship of the IDs of different sizes provided on the element prior to division by cutting. Furthermore, the photovoltaic elements of the same shape are obtained after the division by cutting, but the position in the mass production apparatus can be confirmed from the difference in the size of ID. In the following there will be explained an example of the specific effect derived from such fact.

The semiconductor layer involves an unevenness in the film quality. Such unevenness results from an unevenness in the film forming condition, which in turn is derived from the structure of the apparatus or the maintenance state thereof. For example, in case of depositing a semiconductor layer by CVD onto a substrate, the film formation is executed by generating plasma in a gaseous mixture constituting the material for the semiconductor film such as silane gas and decomposing such gaseous mixture, and plasma discharge becomes uneven in case of film formation on a large-area substrate. Such unevenness in the plasma discharge results from various causes such as a small bending of the substrate, an unbalance in the outputs of a plurality of power sources for generating discharge, or precipitation of by-products generated in the decomposition of the gaseous mixture.

In case of roll-to-roll film formation under continuous conveying of the substrate at a constant speed, such unevenness in the film forming condition appears little in the conveying direction of the substrate but principally appear in the width direction thereof. Also in the conveying direction of the substrate, the unevenness is generated with the elapse of time of the film forming condition, but shows a milder distribution in comparison with that in the width direction of the substrate.

Empirically, the distribution of the characteristics in the width direction of the substrate is constant within a rolled substrate. For example, there may result a situation where the performance is higher at the front side of the film forming apparatus and lower at the rear side of the apparatus. Therefore, as the width direction of the substrate is along the direction 3B—3B of the photovoltaic element shown in FIGS. 3A to 3E, when divided by cutting along the direction 3C—3C, the photovoltaic elements are divided into those of a higher performance and those of a lower performance.

As explained in the foregoing, all the photovoltaic elements are subjected to the performance inspection prior to the division by cutting of the slabs, and are judged as passing/non-passing based on the result of such performance inspection, but all the divided elements are not subjected to the performance inspection after the division by cutting.

However, there was found a photovoltaic element which passed the performance inspection prior to division by cutting but failed to meet the standard value in the performance inspection executed on ones extracted from the photovoltaic elements after the division by cutting. Investigation on the cause identified that a large unevenness in the film forming condition was generated from a failure in the power source for causing plasma discharge and that the performance distribution within the photovoltaic element became unnegligibly large. As a result, it was found that the normal film thickness was obtained in the semiconductor layer at the front side of the film forming apparatus, and the normal film formation could not be obtained at the rear side of the apparatus.

Because of such situation, it became necessary to classify the photovoltaic elements after division by cutting according to the positions thereof (namely front side of the semiconductor layer forming apparatus (front side in the film forming apparatus shown in FIG. 5) and rear side of the apparatus (rear side in the apparatus shown in FIG. 5), and to discard the elements belonging to the rear side of the apparatus. Conventionally it was necessary to discard all the elements because such classification (at the front side or rear side of the apparatus) was impossible, but, in the present example, it is possible to classify the elements positioned at the front side of the semiconductor layer forming apparatus and those positioned at the rear side of the apparatus by visually judging the size of the ID bar code, through the shape of the elements is the same after the division by cutting. More specifically, it was possible to identify that the photovoltaic element 301*a* having a larger ID bar code was positioned in the front side of the semiconductor layer forming apparatus and that the photovoltaic element 301*b* having a smaller ID bar code was positioned in the rear side of the semiconductor layer forming apparatus. It was thus rendered possible to select the photovoltaic elements of lower performance and to discard such defective elements only.

EXAMPLE 2

The present example provides a photovoltaic element having an amorphous semiconductor film, in which the web-shaped substrate after being discharged from the mass production apparatus is cut into slabs but is no longer subjected to the division by cutting. The photovoltaic element is symmetrical in the vertical and lateral directions, and is provided with 4 IDs for identifying the direction of the element in the mass production apparatus based on the difference in size by visual confirmation.

Figure 8A:
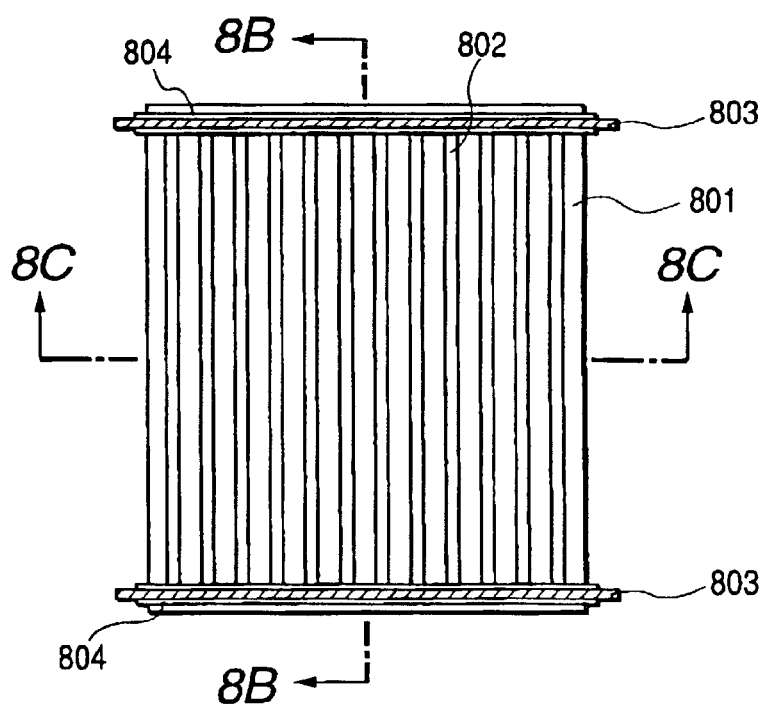
FIG. 8A is a plan view of a photovoltaic element of Example 2.
Figure 8B:
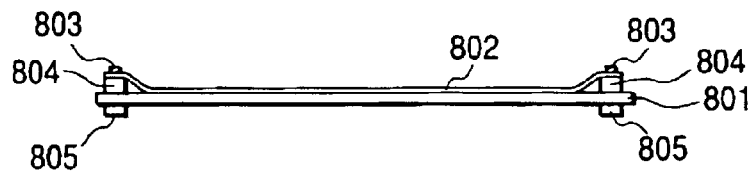
FIG. 8B is a cross-sectional view taken along the line 8B—8B of FIG. 8A.
Figure 8C:
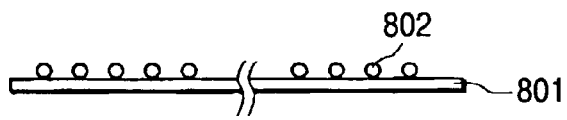
FIG. 8C is a cross-sectional view taken along the line 8C—8C of FIG. 8A.
Figure 8D:
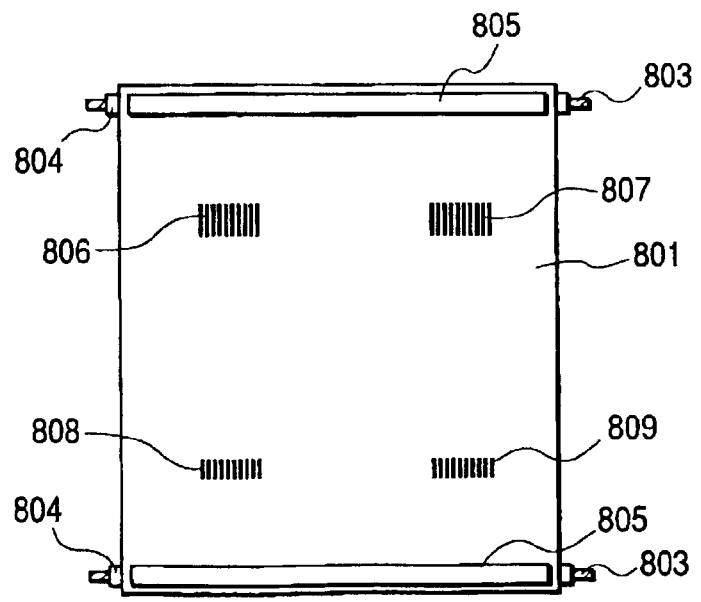
FIG. 8D is a bottom plan view of the photovoltaic element shown in FIG. 8A.

FIGS. 8A to 8D show the photovoltaic element of the present example, wherein FIG. 8A is a top plan view thereof, FIG. 8B is a cross-sectional view taken along the line 8B—8B of FIG. 8A, FIG. 8C is a cross-sectional view taken along the line 8C—8C of FIG. 8A, and FIG. 8D is a bottom plan view therof. In FIGS. 8A to 8D, there are shown a semiconductor substrate 801, a current-collecting electrode 802, a positive electrode lead terminal 803, a double-sticking insulating tape 804, a negative electrode lead terminal 805, and IDs 806, 807, 808, 809.

The IDs 806, 807, 808, 809 are printed in four positions on the back side of the semiconductor substrate 801, and have the same information for machine reading. Also the IDs 806, 807, 808, 809 are printed in different print sizes, whereby it is confirmed that the IDs 806 and 807 and the IDs 808 and 809 can be visually different from one another. In the present example, similarly as in Example 1, the IDs 806 and 807 of a larger size are printed on the front side of the element and the IDs 808 and 809 of a smaller size are printed on the rear side of the element, in the processing chambers of the mass production apparatus for the semiconductor layer.

The photovoltaic element of the present example is the same as that in Example 1 except that the division by cutting is not executed, so that the configuration and the producing method will not be explained further. Since the division by cutting is not executed, the dividing tape for cutting is naturally not employed.

The photovoltaic element of the present example is symmetrical in shape, but the direction in the mass production apparatus can be confirmed from the different sizes of the IDs. In the following there will be explained an example of the specific effect derived from such fact.

Once defective performance was frequently found in the performance inspection step for the photovoltaic element. The analysis of the photovoltaic element defective in performance proved a fine line-shaped scar on the surface. The scar was parallel to the conveying direction of the photovoltaic element (direction of the line 8C—8C of FIG. 8A), and was positioned about 10 mm from the end of the photovoltaic element, and the element was estimated to be damaged somewhere in the mass production apparatus.

In such case, unless the location in the mass production apparatus causing the damage on the element is specified and the maintenance of the apparatus is executed immediately, the mass production apparatus will have to be stopped, thus resulting in a loss in the work rate and an increase in the cost. However, since the mass production apparatus involves a very large number of steps, there is required a long time in order to specify the generating position of such scar.

In such situation, since the present example allowed to identify the direction of the photovoltaic element in the semiconductor layer forming apparatus, it was easily possible to that the aforementioned scar was generated at the front side in the semiconductor layer forming apparatus. More specifically, the scars were deviated at the side of the larger bar code as the ID, which was positioned at the front side of the semiconductor layer forming apparatus, so that it was only required to investigate a position of a distance of 10 mm from the element end from the side of the operation panel (front side of the apparatus). Also in other film forming apparatus, if the position (front side or rear side) of the element in the semiconductor layer forming apparatus is known, there can be derived the position of the element in such other film forming apparatus so that the portion to be investigated in such film forming apparatus can be similarly limited to achieve very efficient trouble shooting.

In this manner, the investigation for the scar generating position in each film forming apparatus could be made within a limited area to achieve prompt trouble shooting, thereby preventing increase in cost without interrupting the production.

EXAMPLE 3

The present example provides a photovoltaic element having a crystalline semiconductor film, which is not subjected to division by cutting after being discharged from the mass production apparatus. The photovoltaic element is symmetrical in the lateral direction, and is provided with 2 IDs for identifying the direction of the element in the mass production apparatus based on the difference in color by visual confirmation.

Figure 9A:
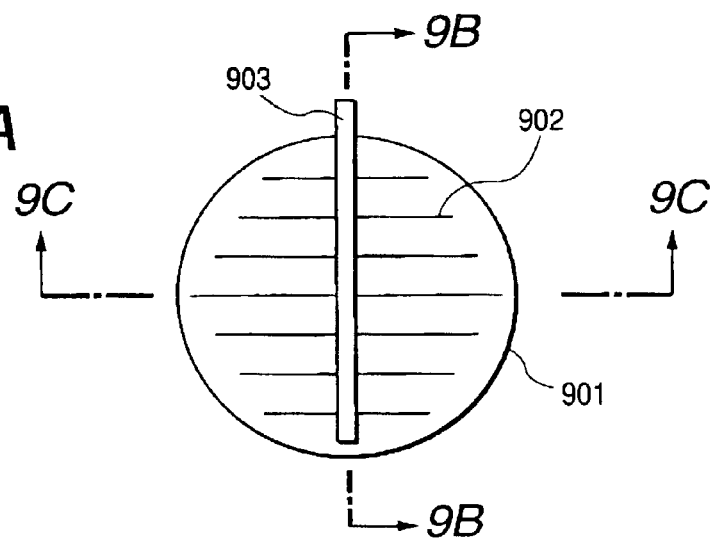
FIG. 9A is a plan view of a photovoltaic element of Example 3.
Figure 9B:
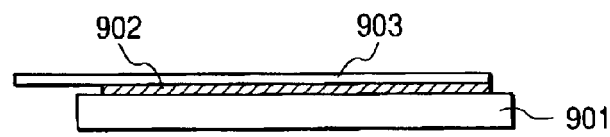
FIG. 9B is a cross-sectional view taken along the line 9B—9B of FIG. 9A.
Figure 9C:
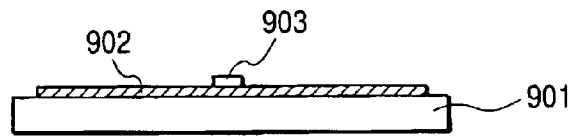
FIG. 9C is a cross-sectional view taken along the line 9C—9C of FIG. 9A.
Figure 9D:
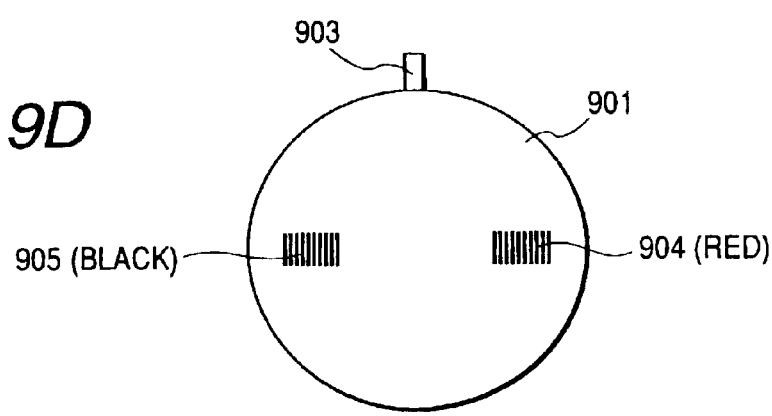
FIG. 9D is a bottom plan view of the photovoltaic element shown in FIG. 9A.

FIGS. 9A to 9D show the photovoltaic element of the present example, wherein FIG. 9A is a top plan view thereof, FIG. 9B is a cross-sectional view taken along the line 9B—9B of FIG. 9A, FIG. 9C is a cross-sectional view taken along the line 9C—9C of FIG. 9A, and FIG. 9D is a bottom plan view thereof.

The lower surface and upper surface of a crystalline silicon semiconductor 901 were doped with boron irons and phosphor ions, respectively. The lower surface of the crystalline silicon semiconductor 901 was coated with an aluminum paste as a back reflection layer (now shown) and further with a silver paste as a back electrode (not shown), under which there was further provided a solder layer (not shown).

The upper surface of the crystalline silicon semiconductor 901 was coated with a transparent electrode layer (not shown) for antireflection and current collection, further with a sintered silver paste, and furthermore with a solder layer. In FIGS. 9A to 9D, the silver paste and the solder layer are collectively indicated as the current-collecting electrode 902. On the current-collecting electrode 902, a copper foil was adjoined by soldering as the terminal member 903.

The IDs 904 and 905 were composed of bar codes printed by ink jet system in two positions on the back surface of the crystalline silicon semiconductor 901. The ID 904 was printed with red color at the downstream side and the ID 905 was printed with black color at the upstream side of the conveying direction, in the semiconductor film forming chambers of the mass production apparatus. The IDs have the same production management number for machine reading. The reading operation is executed on the ID 904 among the IDs.

The present example allows to confirm the direction of the photovoltaic element in the mass production apparatus from the difference in color, thereby providing effects similar to those in Example 2.

As explained in the foregoing, the prevent invention provides the following effects.

(1) Since it can be visually confirmed that the plurality of IDs provided on the article to be processed are different, in case of a trouble, the personnel in the production site can easily identify the position or direction of the article to be processed in the mass production apparatus based on the positional relationship of the plurality of IDs, thereby restricting the trouble generating position in the mass production apparatus and enabling prompt response to the trouble. In this manner, there can be achieved prompt feedback to the maintenance of the apparatus, thereby preventing the loss in production yield resulting from the trouble and achieving a reduction in the cost.

(2) Since the plurality of IDs provided on the article to be processed have the same information for machine reading, the existing management system need not be changed and a prompt response to the trouble in production can be achieved with a low cost.

(3) Even in case of an error in ID reading, a countermeasure can be achieved by reading another adjacent ID, thereby completely avoiding the interruption of the operation of the apparatus resulting from such ID reading error.

(4) Particularly when the plurality of IDs are provided in such positions that at least one ID is provided in each article to be processed after division by cutting, the selection by the processed position in the mass production apparatus is rendered possible even after the division by cutting, whereby the selection of the defective products in case of a trouble can be achieved precisely and the cost reduction can be achieved without unnecessary discarding of the products.

What is claimed is:

1. An article to be processed, comprising a plurality of IDs having the same information for machine reading such that each of the plurality of IDs results in the same readout when read by a machine, wherein the plurality of IDs have at least two kinds of external appearances which are visually different from each other, and wherein the article is a photovoltaic element.

2. The article according to claim 1, wherein the plurality of IDs can be classified into at least two kinds by difference in at least one of color, shape and size.

3. The article according to claim 1, wherein a mutual positional relationship of the plurality of IDs is information corresponding to a direction or position of the article in an apparatus for producing the article.

4. The article according to claim 1, wherein at least one of the plurality of IDs is a bar code.

5. The article according to claim 1, wherein at least one of the plurality of IDs is printed with ink.

6. The article according to claim 1, wherein at least one of the plurality of IDs includes information of a production management number.

7. The article according to claim 1, wherein the article has a symmetrical shape.

8. The article according to claim 1, wherein the article is divided by cutting into a plurality of articles to be processed.

9. The article according to claim 8, wherein the plurality of IDs is provided in such positions that at least one of the plurality of IDs is provided on each of the plurality of articles.

10. A method for producing an article to be processed, comprising a step of forming, on the article to be processed, a plurality of IDs having the same information for machine reading such that each of the plurality of IDs results in the same readout when read by a machine, wherein the plurality of IDs have at least two kinds of external appearances which are visually different from each other, and wherein the article is a photovoltaic element, and the plurality of IDs is formed after a step of forming a semiconductor layer.

11. The method according to claim 10, wherein the article has a symmetrical shape, and wherein the method further includes a conveying step involving a directional change of the article.

12. The method according to claim 10, further comprising a step of mechanically reading at least one of the plurality of IDs, wherein, in case one of the plurality of IDs cannot be read, one of the plurality of IDs adjacent to the one ID which cannot be read is read.

13. The method according to claim 10, wherein the article is divided by cutting into a plurality of articles to be processed, and the plurality of IDs is positioned such that at least one of the plurality of IDs is provided on each of the plurality of articles.

14. The article according to claim 1, wherein the plurality of IDs have the same machine-readable production management number.

15. The method according to claim 10, wherein the plurality of IDs have the same machine-readable production management number.

* * * * *

UNITED STATES PATENT AND TRADEMARK OFFICE
CERTIFICATE OF CORRECTION

PATENT NO. : 6,963,787 B2
APPLICATION NO. : 10/207865
DATED : November 8, 2005
INVENTOR(S) : Takeshi Takada et al.

It is certified that error appears in the above-identified patent and that said Letters Patent is hereby corrected as shown below:

COLUMN 2
Line 17, "details." should read --detail.--; and
Line 55, "The Ids" should read --The IDs--.

COLUMN 3
Line 17, "cases" should read --causes--;
Line 49, "cause" should read --arise--; and
Line 64, "is however" should read --is, however,--.

COLUMN 4
Line 31, "of Ids" should read --of IDs--.

COLUMN 5
Line 16, "article" should read --articles--.

COLUMN 6
Line 10, "article having" should read --having--; and
Line 61, "limited" should read --limited to--.

COLUMN 7
Line 47, "of Ids," should read --of IDs,--;
Line 51, "remarkably" should read --remarkable--;
Line 53, "only a" should read --only--;
Lne 64, "difference" should read --differences--; and
Line 65, "different" should read --different from--.

COLUMN 8
Line 2, "difference" should read --differences--;
Line 3, "difference" should read --differences--; and
Line 29, "composed," should read --composed of,--.

COLUMN 9
Line 34, "current-col-" should read --current- --; and
Line 35, "lecting" should read --collecting--.

COLUMN 10
Line 44, "discharged" should read --being discharged--;
Line 48, "to confirm" should read --confirmation of--; and
Line 56, "therof." should read --thereof.--.

UNITED STATES PATENT AND TRADEMARK OFFICE
CERTIFICATE OF CORRECTION

PATENT NO. : 6,963,787 B2
APPLICATION NO. : 10/207865
DATED : November 8, 2005
INVENTOR(S) : Takeshi Takada et al.

It is certified that error appears in the above-identified patent and that said Letters Patent is hereby corrected as shown below:

COLUMN 12
Line 51, "to identify" should read --identification of--; and
Line 65, "defect" should read --defective--.

COLUMN 14
Line 2, "the division" should read --division--;
Line 10, "to identify" should read --indentification of--; and
Line 58, "appear" should read --appears--.

COLUMN 15
Line 31, "FIG. 5)," should read --FIG. 5)),--;
Line 39, "through" should read --though--; and
Line 65, "therof." should read --thereof.--.

COLUMN 16
Line 28, "proved" should read --revealed--; and
Line 44, "to that" should read --that--.

COLUMN 17
Line 12, "irons" should read --ions--;
Line 15, "(now" should read --(not--; and
Line 36, "to confirm" should read --confirmation of--.

Signed and Sealed this

Thirteenth Day of February, 2007

JON W. DUDAS
*Director of the United States Patent and Trademark Office*